United States Patent [19]

Sellberg et al.

[11] 3,963,989

[45] June 15, 1976

[54] MIXER STAGE FOR MICROWAVE RECEIVERS

[75] Inventors: Florian Sellberg; Peter Weissglas, both of Djursholm, Sweden

[73] Assignee: Institutet for Mikrovigsteknik, Stockholm, Sweden

[22] Filed: Apr. 18, 1974

[21] Appl. No.: 461,975

[30] Foreign Application Priority Data

May 7, 1973 Sweden............................... 7306344

[52] U.S. Cl................................ 325/449; 321/69 W
[51] Int. Cl.².................... H04B 1/26; H02M 5/16
[58] Field of Search .......... 325/442, 445, 446, 449, 325/444, 451; 357/13; 321/69 W, 69 NL

[56] References Cited

UNITED STATES PATENTS

| | | | |
|---|---|---|---|
| 3,404,318 | 10/1968 | Lindmayer et al.................. | 325/449 |
| 3,673,514 | 6/1972 | Coleman............................... | 357/13 |
| 3,747,096 | 7/1973 | Olesen et al........................ | 325/446 |

Primary Examiner—John C. Martin

[57] ABSTRACT

A mixture stage for microwave receivers for generating an intermediate frequency signal utilizes a diode including a forward biassed and reverse biassed junction in series placed in a microwave transmission line to which the received signal and the local oscillator signal are supplied.

6 Claims, 7 Drawing Figures

MIXER STAGE FOR MICROWAVE RECEIVERS

The present invention refers to a mixer stage for microwave receivers, for mixing a received signal and a local oscillator signal to an intermediate frequency signal by means of using at least one non-linear element.

In a microwave receiver, for instance a radar receiver, the received signal, possibly after amplification, is mixed with a high frequency signal generated by a local oscillator in the receiver so as to obtain an intermediate frequency signal. As a mixer stage usually a transmission line element is used, both the high frequency signals being supplied to the element and the difference frequency being obtained from non-linear elements, usually diodes, arranged in the line. The demands to be met by such a mixer stage are a low noise factor, a wide dynamic range with constant gain, resistance against overload, and simple and cheap design.

In mixer stages known per se the non-linear elements usually consist of diodes comprising a Schottky-barrier, i.e. a junction of a metal and a doped semiconductor, or a tunnel diode. The drawback of these diodes is that a very thin depletion layer i.e. a high diode capacity, is obtained, this capacity having the effect of short-circuiting the diode at high frequencies. In order to avoid such a short-circuit the area of the diode has to be made very small. The small area will however necessarily imply a low power endurance and furthermore the field strength at reverse biassing will rapidly reach the ionization value whereby a destructive discharge at the sharp metal edge will appear. In order to avoid that the diode is destroyed due to overload the receiver therefore usually has to be provided with some power limiter, possibly combined with an electro-mechanical shutter which disconnects the mixer when not used. The introduction of a power limiter and a shutter does however make the receiver considerably more costly and furthermore the introduction of these elements will imply a higher noise level.

It is an object of the present invention to provide a mixer stage for a microwave receiver, the stage having a simple and cheap design and such a high power endurance that the power limiter and shutter elements can be eliminated.

The characteristics of the invention will appear from the claims attached to the specification.

The invention will now be described in detail, reference being made to the enclosed drawing, in which.

Figure 5A:
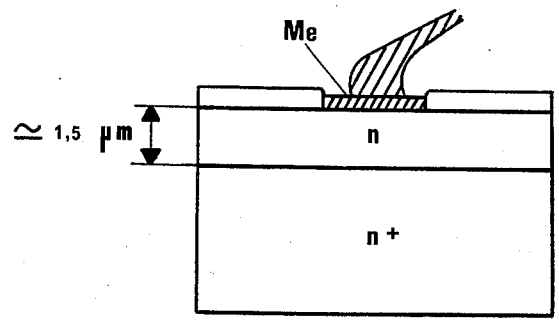
Figure 6:
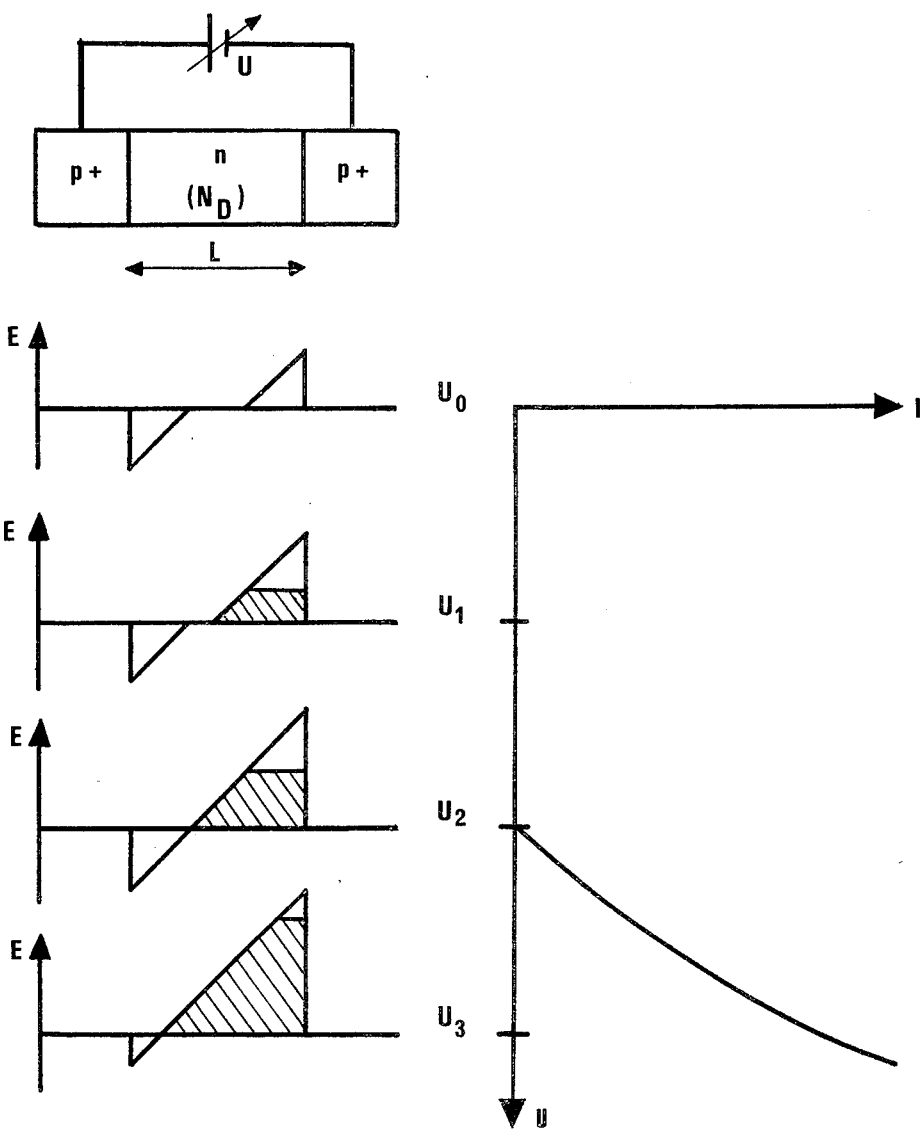

FIGS. 5a and b show different embodiments of diodes used in conventional mixers; and FIG. 6 shows the design of the diode comprised in the mixer stage according to the invention and the field strength and current characteristics for such a diode.

Figure 1:
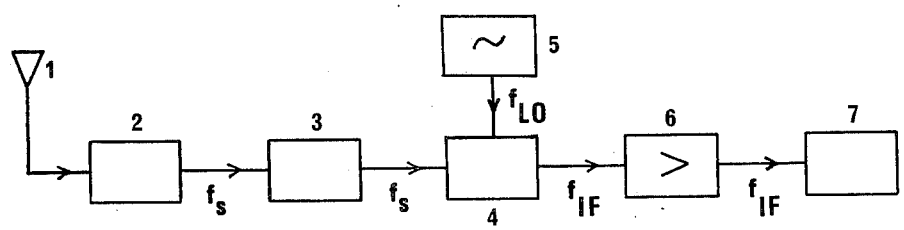
FIG. 1 is a block diagram covering parts of a radar receiver.

In FIG. 1, which shows the first part of a radar receiver, reference 1 denotes a receiving antenna from which the received signals are transferred to a mixing stage 4 via a transmit-receive switch 2 and a limiter 3. In the mixer stage 4 the received signal is mixed with a local oscillator signal supplied from a local oscillator 5 so as to obtain an intermediate frequency signal. This signal is then trnsferred to an amplifier 6 and further on to a unit 7 for transforming the signal to video frequency and evaluation. The design of the schematically shown mixer stage 4 will now be described in detail in connection with FIGS. 2-5.

Figure 2:
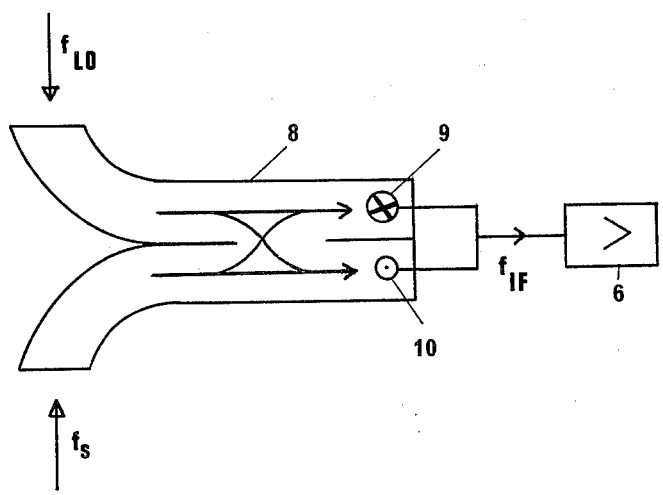
FIGS. 2-4 show different embodiments of the mixer stage to be used in the receiver according to FIG. 1.

FIG. 2 shows the design of a so-called balanced mixer stage. The received signals and the local oscillator signal $f_{LO}$ are supplied to a waveguide element 8 consisting of two coupled waveguides, a so-called 3 dB-hybrid. In this waveguide element the input signals are split into halves, one half being transferred to the adjacent waveguide and thereby being phase-shifted 90°. In the waveguide element two diodes 9 and 10 are arranged in opposition so that these diodes will receive one half of the input signal and local oscillator signal respectively, one of said signals being phase-shifted 90°. Since the diodes are connected in opposition the intermediate frequency signals are added while noise from the local oscillator is extinguished which is a characteristic feature in this type of mixer.

Figure 3:
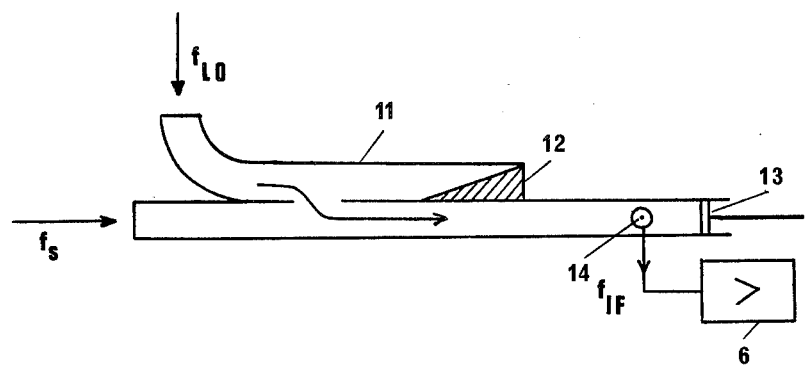

In FIG. 3 is shown an unbalanced mixer stage comprising only one diode 14 arranged in a waveguide element 11 consisting of a first waveguide to which the received signal $f_s$ is supplied and a second waveguide to which the local oscillator signal is supplied, the second waveguide being lightly coupled to the first one and terminated by a body 12 consisting of absorbing material. For matching the diode 14 the waveguide is further provided with a piston 13.

Figure 4:
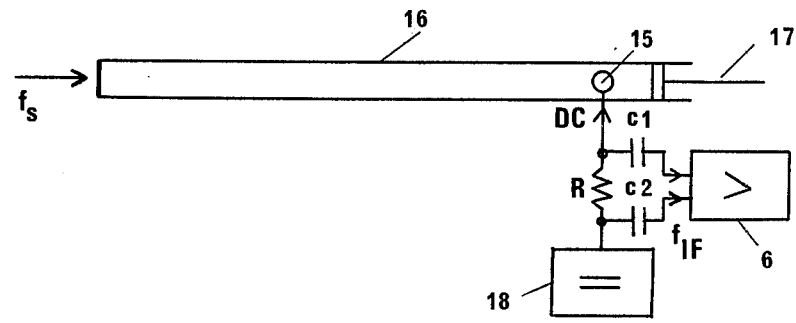

In FIG. 4 is shown a third embodiment of the mixer stage 4, a diode 15 being arranged in a waveguide 16 provided with a tuning piston 17. The diode could be of the type to be described in connection with FIG. 6 and is designed to have a negative differential resistance for the frequency to be used provided that a suitable biassing voltage is applied. The diode 15 is fed from a direct voltage source 18 and can thereby be made to oscillate in the waveguide 16 by suitable tuning by means of the piston 17, the diode thus also operating as a local oscillator. The waveguide 16 is also supplied with the incoming signal $f_s$. The intermediate frequency signal obtained from the local oscillator signal and the received signal appears across a resistor R and is fed to the intermediate frequency amplifier 6 via two capacitors C1 and C2.

Figure 5B:
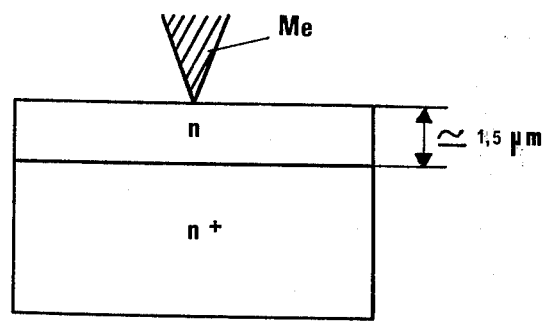

In the above described per se known mixer stages the mixing is obtained by using the non-linear characteristic of the diode obtained from the exponential relation between current and voltage. The diodes normally used are diodes comprising a Schottky-barrier, i.e. a junction of metal and doped semiconductor. The design of such a diode is shown in FIG. 5a where Me denotes a metal layer, n denotes a lightly doped semiconductor and $n^+$ a heavily doped semiconductor which forms the contact for the ligthly doped layer. As mentioned above these diodes have to be designed with a very small area in order that the diode capacity shall not short-circuit the diode at high frequencies. It is thus very common to design them as so-called point-contact diodes as shown in FIG. 5b, i.e. diodes where the contact surface between the metal and the doped layer is extremely small. An essential drawback of these diodes consists therein that due to the small area the diodes are easily destroyed if subjected to high powers which is often the case in radar receivers, for instance due to the transmitted radar pulse leaking into the receiver or reflections from nearby situated targets or pulses from other transmitters reaching the receiver. In order to eliminate this drawback and obtain a mixing stage which is very power enduring, the mixer stage according to the invention uses a so-called BARITT (BARrier Injection and Transit Time) diode the design of which will be described below.

In FIG. 6 is shown at the top of the figure a per se known BARITT diode which could be manufactured by using planar or mesa technique. As appears from the figure this diode consists of two counteracting pn-junctions which also could be made as Schottky-barriers, i.e. the layers denoted $p^+$ could be substituted by metals. Complementary material could also be used. When the BARITT diode is biased with increasing voltages field strengths in accordance with the diagram at the lower left of the figure are obtained. Until the value U2, when the complete n area is depleted of moveable charge carriers, is reached only the reverse-bias saturation current can pass through the diode. When the complete n region is depleted the left part of the diode can be biased in the forward direction, and as the voltage is raised the current increases exponentially as appears from the current-voltage diagram at the lower right of FIG. 6. Compared with a single pn-junction the BARITT diode could be used for higher frequencies since no limitation due to the relatively long life time of the minority carriers is introduced. Like in a Schottky diode the complete charge transport is performed by one type of charge carriers which due to the high field strength will rapidly be transferred to the contacts where they are majority carriers. The BARITT diode differs however from a simple Schottky-barrier diode in that the depletion layer will be considerably wider due to the fact that a reverse-biased diode is also obtained. Thus for the same capacity larger diode area and volume can be obtained which increases the power endurance. If the product $N_D \cdot L$ of the BARITT diode, where L denotes the width of the central layer and $N_D$ denotes the density of donors, is made sufficiently small ($10^{12}/cm^2$ for silicon) there is also no risk for ionization since the field strength will hardly reach critical values. Especially if the BARITT diode is made by means of planar technique sharp edges and thus high field-concentrations will be avoided. Thus by using a BARITT diode a considerably higher power endurance would be obtained in comparison with a simple Schottky diode. The drawback of a BARITT diode is that the voltage has to be raised also across the reverse biased diode-half in order to make the current increase, which means that the differential resistance of the diode will be higher than the corresponding value for an ideal diode. In a mixer application this could be compensated by biasing the diode with a higher direct current than is used in conventional diodes and furthermore a higher local oscillator power could be used. This may however imply a somewhat higher noise factor since the shot noise from the direct current increases. The use of a biasing voltage and a higher local oscillator power will however generally be considerably cheaper than the use of a limiter and a shutter. The dynamic range will furthermore be at least as wide as for conventional mixer diodes.

With the exception of the embodiment according to FIG. 4 it has been presumed that the BARITT diode is so short that a positive resistance is obtained for all frequencies up to the microwave frequency used, i.e. the diode operates as a passive mixer diode. In the normal use of BARITT diodes in oscillators and amplifiers the diode is however made longer so that due to transit time effects a negative microwave resistance is obtained. If in a mixing stage according to the invention the diode is given such a design, different forms of active mixers i.e. mixers with signal amplification could be obtained. In the embodiments according to FIGS. 2 and 3 the diode should hereby be coupled to the waveguide in such a way that it does not oscillate whereas in the embodiment shown in FIG. 4 it is required that the diode oscillates. FIG. 4 could also illustrate the case where an antenna is connected directly to the waveguide 16 so that the received signal is a doppler displaced or by other means from an outer load affected reflection of the local oscillator. Thereby a homodyne doppler radar is obtained where the diode simultaneously constitutes the active element in the transmitter and the local oscillator as well as the non-linear element in the mixer. Similar applications using Gunn- or IMPATT-diodes are known per se, but the low inherent noise and high degree of non-linearity of the BARITT diode make this diode superior to the other diodes hitherto used for this purpose.

We claim:

1. In a mixer for a microwave receiver and being responsive to a local oscillator signal and a received signal, the improvement comprising in combination:
a pair of coupled waveguides respectively having said local oscillator signal and said received signal applied thereto;
at least one barrier injection and transit time diode located in one of said pair of waveguides, said diode being operated in a non-oscillatory mode for mixing said local oscillator signal and said received signal to produce an intermediate frequency signal thereby; and
means connected to said diode for coupling said intermediate frequency signal from said diode.

2. The mixer as defined by claim 1 wherein said at least one barrier injection and transit time diode comprises a single diode forming an unbalanced mixer thereby.

3. The mixer as defined by claim 2 and additionally including:
bias voltage generating means adapted to produce a potential sufficient to cause said single diode to function with a negative resistance characteristic; and
means applying said bias voltage to said single diode so that said negative resistance characteristic effects signal amplification of said intermediate frequency signal.

4. The mixer as defined by claim 1 and additionally including another barrier injection and transit time diode located in the other of said pair of waveguides and operated in a nonoscillatory mode to form a balanced mixer.

5. The mixer as defined by claim 4 wherein said at least one diode and said another diode are mounted in their respective waveguides in mutually opposite polarity senses.

6. The mixer as defined by claim 4 and additionally including:
bias voltage generating means adapted to produce a potential sufficient to cause both said diodes to function with a negative resistance characteristic; and
means applying said bias voltage to both said diodes so that said negative resistance characteristic effects signal amplification of said intermediate frequency signal.

* * * * *